(12) United States Patent
Konchan

(10) Patent No.: US 9,131,636 B2
(45) Date of Patent: Sep. 8, 2015

(54) METHOD OF MANUFACTURING ELECTRICAL CIRCUIT TRACES

(71) Applicant: GM Global Technology Operations LLC, Detroit, MI (US)

(72) Inventor: Jeffrey L. Konchan, Romeo, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 168 days.

(21) Appl. No.: 13/799,340

(22) Filed: Mar. 13, 2013

(65) Prior Publication Data

US 2014/0262439 A1    Sep. 18, 2014

(51) Int. Cl.
| | |
|---|---|
| H05K 1/00 | (2006.01) |
| H05K 1/09 | (2006.01) |
| H05K 13/00 | (2006.01) |
| H05K 1/02 | (2006.01) |
| H05K 3/20 | (2006.01) |
| B60R 16/02 | (2006.01) |
| H05K 3/28 | (2006.01) |

(52) U.S. Cl.
CPC ............... *H05K 13/00* (2013.01); *B60R 16/02* (2013.01); *H05K 1/02* (2013.01); *H05K 3/202* (2013.01); *H05K 3/28* (2013.01); *H05K 2201/0999* (2013.01); *H05K 2203/1327* (2013.01); *Y10T 29/49117* (2015.01)

(58) Field of Classification Search
CPC .... H01L 24/50; H01L 2224/50; H01R 4/182; H01R 12/59; H01R 12/69
USPC .................................................. 174/250, 257
See application file for complete search history.

(56) References Cited

U.S. PATENT DOCUMENTS

| | | | |
|---|---|---|---|
| 4,832,622 A * | 5/1989 | Zahn .............................. | 439/590 |
| 5,178,563 A * | 1/1993 | Reed .............................. | 439/676 |
| 5,547,391 A * | 8/1996 | Benes et al. ................... | 439/399 |
| 5,616,053 A * | 4/1997 | Bogursky et al. ............. | 439/590 |
| 5,725,392 A * | 3/1998 | Bianca et al. ................. | 439/590 |
| 5,775,945 A * | 7/1998 | Bianca et al. ................. | 439/590 |
| 5,975,952 A * | 11/1999 | McCartin ...................... | 439/590 |
| 6,190,209 B1 * | 2/2001 | Hulsmann et al. ............ | 439/660 |
| 6,216,338 B1 * | 4/2001 | Boe ................................ | 29/747 |
| 6,436,517 B1 * | 8/2002 | Zahn .............................. | 428/209 |

* cited by examiner

*Primary Examiner* — Timothy Thompson
*Assistant Examiner* — Sherman Ng
(74) *Attorney, Agent, or Firm* — Cantor Colburn LLP

(57) ABSTRACT

A method of manufacturing an electrical trace includes forming a continuous electrical trace strip having a plurality of electrical trace elements, stamping one or more electrical trace isolators onto the continuous electrical trace strip across select ones of the plurality of electrical trace members forming one or more electrical trace sub-assemblies, and detaching the one or more electrical trace sub-assemblies from the continuous electrical trace strip.

6 Claims, 4 Drawing Sheets

METHOD OF MANUFACTURING ELECTRICAL CIRCUIT TRACES

FIELD OF THE INVENTION

The subject invention relates to the art of electrical systems and, more particularly, to a method of manufacturing electrical circuit traces for an electrical device.

BACKGROUND

Many devices rely upon electrical current for providing power and control signals. Many of the devices, such as computers, audio, and portable electronic devices employ low currents that are passed through conductive pathways formed in printed circuit boards. Other devices rely upon higher currents for operation. In such devices, the higher currents are passed through larger electrical traces formed from a conductive material, such as copper bars supported by insulators. Conventionally, the electrical traces are formed by positioning multiple copper bars/strips joined through one or more bridge sections into a jig, injection molding insulators onto the copper bars, removing the bridge sections to form an electrical trace sub-assembly, and mounting or overmolding the electrical trace sub-assembly into a system component. The time and complexity for forming the electrical traces increases overall manufacturing costs for the system component. Accordingly, it is desirable to provide a method of manufacturing electrical traces that reduces manufacturing costs and complexity.

SUMMARY OF THE INVENTION

In accordance with an exemplary embodiment, a method of manufacturing an electrical trace includes forming a continuous electrical trace strip having a plurality of electrical trace elements, stamping one or more electrical trace isolators onto the continuous electrical trace strip across select ones of the plurality of electrical trace members forming one or more electrical trace sub-assemblies, and detaching the one or more electrical trace sub-assemblies from the continuous electrical trace strip.

In accordance with another exemplary embodiment, an electrical device including one or more electrical trace sub-assemblies is formed by a method including forming a continuous electrical trace strip having a plurality of electrical trace elements, stamping one or more electrical trace isolators onto the continuous electrical trace strip across select ones of the plurality of electrical trace members forming one or more electrical trace sub-assemblies, and detaching the one or more electrical trace sub-assemblies from the continuous electrical trace strip.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

Figure 1:
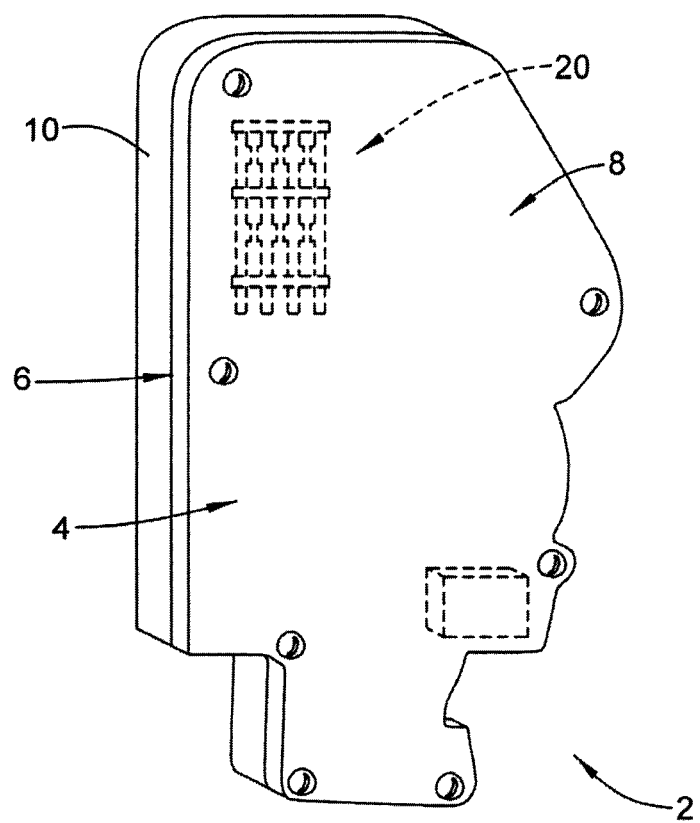
FIG. 1 is a perspective view of an electrical device including electrical trace sub-assemblies constructed in accordance with an exemplary embodiment.

An electrical device is indicated generally at 2 in FIG. 1. Electrical device 2 is shown in the form of a motor vehicle door latch system 4 including a housing 6 having a first housing portion 8 and a second housing portion 10. An electrical trace sub-assembly 20 is molded into first housing portion 8. More specifically, first housing portion 8 is overmolded onto electrical trace sub-assembly 20. The following description is merely exemplary in nature and is not intended to limit the present disclosure, its application or uses. It should be understood that throughout the drawings, corresponding reference numerals indicate like or corresponding parts and features.

Figure 2:
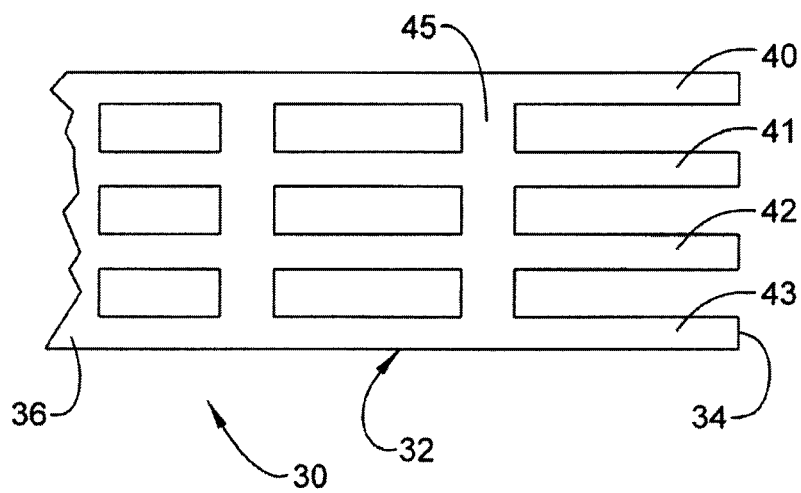
FIG. 2 is a partial plan view of a continuous electrical trace strip having a plurality of electrical trace elements in accordance with an exemplary embodiment.
Figure 3:
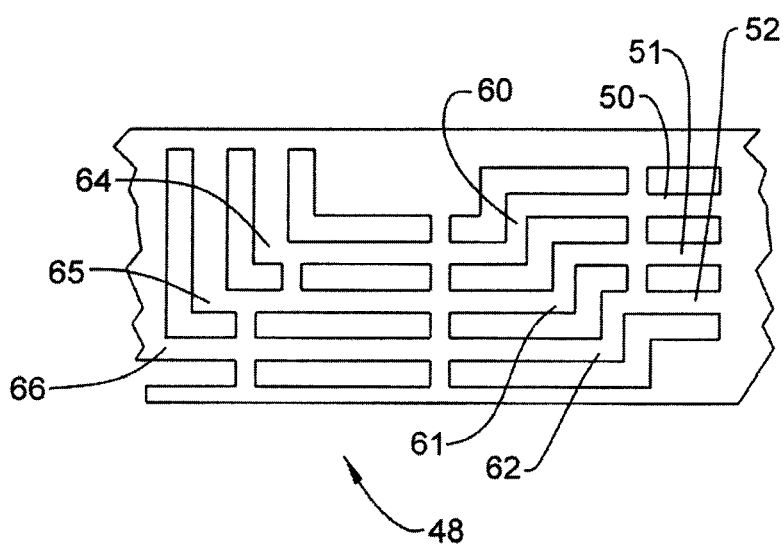
FIG. 3 is a partial plan view of a continuous electrical trace strip having a plurality of electrical trace elements in accordance with another aspect of the exemplary embodiment

In accordance with an exemplary embodiment, electrical trace sub-assembly 20 is formed from a continuous electrical trace strip 30 illustrated in FIG. 2. Continuous electrical trace strip 30 includes a body 32 that extends from a first end 34 to a second end (not shown) through an intermediate portion 36. Body 32 is shown to include a plurality of electrical trace elements 40-43 joined through one or more bridges one of which is indicated at 45. Electrical trace elements 40-43 are substantially linear. However, a continuous electrical trace strip 48 could be formed to include a plurality of electrical trace elements 50-52 as shown in FIG. 3 including bend portions 60-62 and bend portions 64-66 respectively. Bend portions 60-62 and bend portions 64-66 establish a desired routing of electrical trace elements 50-52 to interconnect various electrical elements (not shown).

Figure 4:
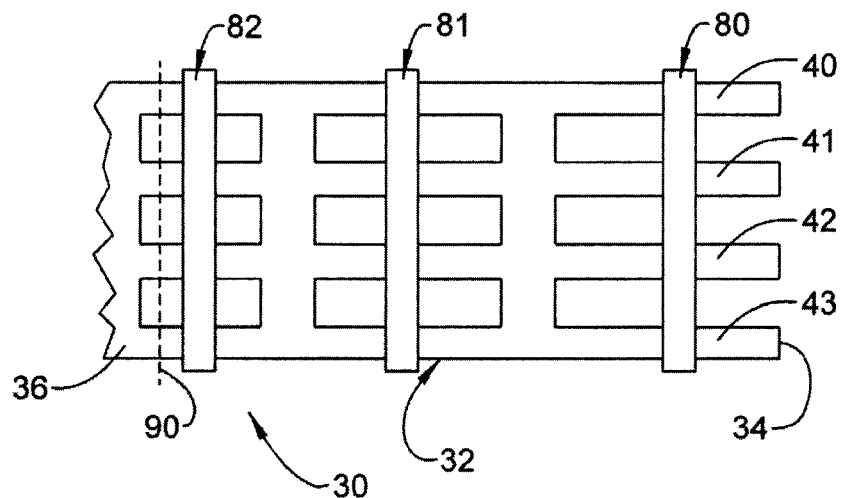
FIG. 4 is a partial plan view of a plurality of electrical trace isolators stamped onto select ones of the plurality of electrical trace elements of FIG. 2.

In further accordance with the exemplary embodiment, a plurality of electrical trace isolators 80-82 are attached to, and across, electrical trace elements 40-43 as shown in FIG. 4. Each electrical trace isolator 80-82 includes a plurality of gripping members such as shown at 93-97, in FIG. 5 and FIG. 6, in connection with electrical trace isolator 80. Each gripping member 93-97 includes first and second hook elements indicated at 100 and 101. First and second hook elements 100 and 101 snap-fittingly retain electrical trace isolator 80 to continuous electrical trace strip 30.

Electrical trace isolators 80-82 maintain a desired spacing between respective ones of electrical trace elements 40-43. The desired spacing provides a desired electrical isolation between each one of electrical trace elements 40-43. Electrical trace isolators 80-82 are stamped, or urged, onto continuous electrical trace strip 30 using a stamping process that may employ a stamping mechanism (not shown) having a holding fixture and a stamping head (also not shown) that retains and guides one or more electrical trace isolators 80-82 onto continuous electrical trace strip 30, as will be detailed more fully below.

Figure 5:
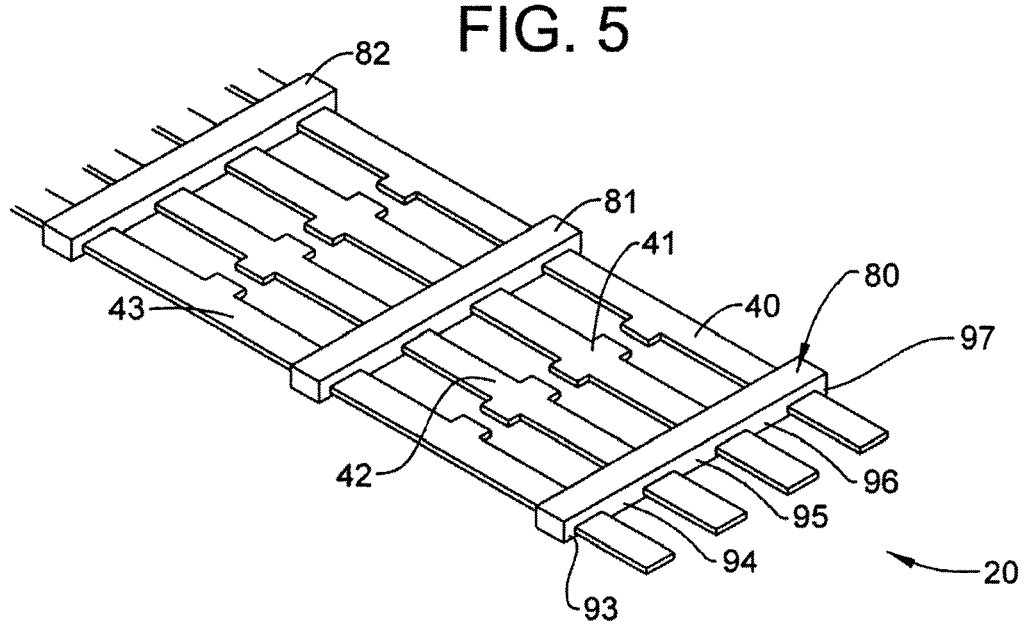
FIG. 5 is a partial perspective view of the plurality of electrical trace elements of FIG. 4 following bridge removal.
Figure 6:
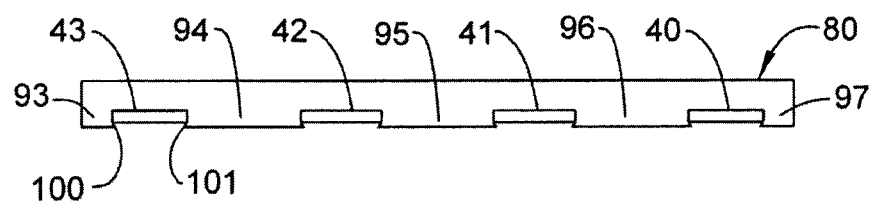
FIG. 6 is an end view of the electrical trace sub-assembly of FIG. 4.

As part of a continuous process, continuous electrical trace strip 30 is fed into a first die station (not shown) of a stamping machine (also not shown). A first stamping process forms electrical trace elements 40-43 joined by bridges 45 as shown in FIG. 2. Continuous electrical trace strip 30 continues forward with electrical trace elements 40-43 passing to a second die station (also not shown). At the second die station, electrical trace isolators 80-82 are fed to a second stamping head (not shown) and selectively snap-fittingly attached across select ones of electrical trace elements 40-43 through a second stamping operation as shown in FIG. 4. At this point, continuous electrical trace strip 30 progresses to a third die station (not shown) at which time a third stamping press (also not shown) removes each bridge 45 as part of a third stamping operation as shown in FIG. 5. In addition, the third die stamp may sever body 32 along an imaginary line such as indicated at 90, FIG. 4, to remove a complete electrical trace sub-assembly 20. Electrical trace sub-assembly 20 may be removed as part of the third stamping operation or as part of a fourth stamping operation. Electrical trace sub-assembly 20 may, by itself, or together with additional electrical trace sub-assemblies, be overmolded into first housing portion 8. Portions of electrical trace sub-assembly 20 may be exposed to provide a connection to electrical elements that are arranged within housing 6.

At this point it should be understood that the exemplary embodiments describe a method of forming an electrical trace sub-assembly from a continuous electrical trace strip. More specifically, prior art electrical trace sub-assemblies are formed by loading linked electrical trace elements into a mold, overmolding trace isolators onto the linked electrical trace elements, removing or cutting away bridge portions linking the electrical trace elements forming a sub-assembly, and then overmolding the sub-assembly into a housing. In contrast, the exemplary embodiment simplifies manufacturing by employing a continuous electrical trace strip with trace isolators that are stamped onto electrical trace elements to form an electrical trace sub-assembly. The electrical trace sub-assembly is cut from the continuous electrical trace strip and overmolded into an electrical device. The exemplary embodiment reduces manufacturing steps, processes and components, realizing a cost and time savings for the production of electrical devices. It should also be understood that while described in terms of forming an electrical device for an automobile, the method may be used to form electrical trace sub-assemblies for a wide array of technologies. Further, it should be understood that the number, shape and length of electrical trace elements forming the continuous electrical trace strip may vary.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the application.

What is claimed is:

1. An electrical device including one or more electrical trace sub-assemblies formed by a method comprising:
    forming a continuous electrical trace strip having a plurality of electrical trace elements;
    stamping one or more electrical trace isolators onto the continuous electrical trace strip across select ones of the plurality of electrical trace elements forming one or more electrical trace sub-assemblies;
    detaching the one or more electrical trace sub-assemblies from the continuous electrical trace strip;
    securing the one or more electrical trace isolators to the select ones of the plurality of electrical trace elements through a plurality of gripping members by capturing each of the select ones of the plurality of electrical trace elements between hook elements provided on each of the two of the plurality of gripping members.

2. The electrical device according to claim 1, wherein stamping the one or more electrical trace isolators into the continuous electrical trace strip includes snap-fitting the one or more electrical trace isolators about the select ones of the plurality of electrical trace elements.

3. The electrical device according to claim 1, further comprising: embedding one or more of the one or more electrical trace sub-assemblies in an electrical device.

4. The electrical device according to claim 3, wherein embedding the one or more of the one or more electrical trace sub-assemblies in the electrical device includes overmolding a housing portion of the electrical device about the one or more of the one or more electrical trace sub-assemblies.

5. The electrical device according to claim 4, wherein overmolding the housing portion of the electrical device about the one or more of the one or more electrical trace sub-assemblies includes overmolding a motor vehicle door latch system housing portion about the one or more of the one or more electrical trace sub-assemblies.

6. The electrical device according to claim 1, wherein forming the continuous electrical trace strip includes shaping one or more of the plurality of electrical trace elements to include at least one bend portion.

* * * * *